i1

(12) United States Patent
Schroetlin

(10) Patent No.: US 7,948,765 B2
(45) Date of Patent: May 24, 2011

(54) RECONFIGURABLE CONTROL PANEL

(75) Inventor: Jamie D. Schroetlin, Springfield, IL (US)

(73) Assignee: Bunn-O-Matic Corporation, Springfield, IL (US)

( * ) Notice: Subject to any disclaimer, the term of this patent is extended or adjusted under 35 U.S.C. 154(b) by 386 days.

(21) Appl. No.: 11/836,671

(22) Filed: Aug. 9, 2007

(65) Prior Publication Data
US 2008/0037232 A1 Feb. 14, 2008

Related U.S. Application Data

(60) Provisional application No. 60/822,117, filed on Aug. 11, 2006.

(51) Int. Cl.
*H05K 7/00* (2006.01)
(52) U.S. Cl. ........................................ 361/760; 174/260
(58) Field of Classification Search .................. 361/760; 174/260
See application file for complete search history.

(56) References Cited

U.S. PATENT DOCUMENTS

| | | | |
|---|---|---|---|
| 3,777,222 A | 12/1973 | Harris | |
| 4,218,600 A * | 8/1980 | Kissner | 200/512 |
| 4,317,011 A * | 2/1982 | Mazurk | 200/5 A |
| 4,685,029 A | 8/1987 | Tillman | |
| 5,146,615 A | 9/1992 | Hodsdon et al. | |
| 5,211,103 A | 5/1993 | Anson | |
| 5,638,052 A * | 6/1997 | Furuya et al. | 340/815.45 |
| 5,734,137 A | 3/1998 | Wakefield | |
| 5,810,597 A * | 9/1998 | Allen et al. | 434/112 |
| 6,259,044 B1 | 7/2001 | Paratore | |
| 6,559,773 B1 | 5/2003 | Berry | |
| 6,661,407 B2 * | 12/2003 | Severson | 345/173 |
| 6,664,486 B2 | 12/2003 | Yoon | |
| 6,686,908 B1 | 2/2004 | Kobayashi | |
| 6,704,005 B2 | 3/2004 | Kato et al. | |
| 6,747,578 B1 | 6/2004 | Lam et al. | |
| 6,874,683 B2 * | 4/2005 | Keronen et al. | 235/380 |
| 7,009,504 B1 | 3/2006 | Banter et al. | |
| 7,602,381 B2 * | 10/2009 | Aiken et al. | 345/173 |
| 2005/0126897 A1 | 6/2005 | Stephens | |

FOREIGN PATENT DOCUMENTS

EP 0334745 A1 3/1989

* cited by examiner

*Primary Examiner* — Jeremy C. Norris
*Assistant Examiner* — Yurity Semenenko
(74) *Attorney, Agent, or Firm* — Barnes & Thornburg LLP

(57) ABSTRACT

A control panel for use with a beverage brewing device is provided. The control panel includes a circuit board and connector assembly in combination with a least one overlay. The circuit board, board includes at least one and commonly a plurality of devices which may include switches and lights. A plurality of overlays are configured for use with control areas. The control areas are analogous to switch controls or light areas which are provided on the circuit board. The overlays may have but are not required to have a one-to-one correspondence with the components on the circuit board. The multiple overlays in combination with a single circuit board allows for a many-to-one combination of overlays to circuit board. Additionally, the circuit board may be programmed to activate or deactivate selected components so that components underlying an overlay without a corresponding control area cannot be activated. Reprogramming may be done in a variety of situation and may be provided in a self programmable configuration which may include, but is not limited to and RFID device carried on at least one of the circuit board and overlay.

16 Claims, 6 Drawing Sheets

RECONFIGURABLE CONTROL PANEL

CROSS REFERENCE TO RELATED APPLICATIONS

This patent application claims the benefit of priority under 35 U.S.C. §119(e) to U.S. Provisional Application Ser. No. 60/822,117, filed Aug. 11, 2006. The disclosure set forth in the referenced provisional application is incorporated herein by reference in its entirety, including all information as originally submitted to the United States Patent and Trademark Office.

BACKGROUND

This invention relates to the field of control panels for electronic devices, and specifically to reconfigurable control panels for beverage brewing and dispensing appliances.

Beverage appliances, such as coffee brewers, are electric appliances that perform various functions at certain times. Control of the machines is generally automatic once the machine has been activated by the operator. To allow operation, interaction and control of the appliance, the brewers have a control panel that includes displays such as lights and alpha-numeric panels, as well as buttons and switches to allow the operator to configure, select options, and activate the appliance. In the prior art, such buttons and switches have been mechanical contact switches such as rocker or push button switch that perform a single function.

In some applications, prior art mechanical switches have been replaced by membrane and other low force actuating switches. These switches provide improved aesthetics, options for tactile feel, configuration options, greater durability, sanitation, and allow incorporation in circuit boards. Such switches also work well with digital logic and controllers. Such systems of control allow reconfiguration of the operation of the switches by changing the software, firmware, or other instruction set or programming of the logic or controller.

In this regard, control panels have been developed which incorporate a printed circuit board, ribbon cable connector, and touch switches. These control panels also may include indicators or display devices such as LED or LCD displays. Such control panels may include a protective overlay on the display or over the entire control panel. Alternatively, the display device will be mounted to a machine independent of a control panel, where the control panel may include a transparent window carried on the control panel providing protective cover over the display when the control panel is positioned over the display.

It is also desirable to use one control panel across a range of machines to reduce manufacturing costs and parts inventory. For instance, one machine may require three brewing options and corresponding buttons to select each option; whereas, another model may only have one brewing option and need only one button. Rather than produce and stock in inventory two panels, savings are realized by producing one panel, with three switches, but deactivating two of the switches for use in the single option machine. This arrangement can be augmented by the use of different faceplates that are configured with different options.

Such reconfigurable control panels may also be advantageous when used with the same machine. A single machine may be capable of different configurations, such as a machine that brews both coffee and tea or a machine that brews different recipes of coffee. A reconfigurable panel will contain all of the buttons needed for operation of either configuration. A removable faceplate or overlay will present to the user only buttons needed for a particular configuration, such as a coffee brewer. Portions of the overlay that are placed over buttons that should be inactive, are blanked out so that the presence of the underlying buttons on the control panel is not readily apparent to the user. Since the control panel is a more expensive component to design and produce, it would be advantageous to produce a single type. This reduces the number and variations in the board and increases the numbers of boards which are produced. An increase in the numbers may produce a reduction in cost due to the economies of scale.

The face plates are relatively inexpensive to manufacture, generally through a printing process, and a variety of faceplates can be produced. Additionally, faceplates can be customized for particular customers. For example, a customer may wish to place their name or specific color combinations or control configurations on the faceplate. As long as the control figurations correspond to the switch locations on the control panel, any variety can be produced.

In order for the machine to recognize which faceplate or overlay is being used, and hence what configuration the control panel should take, the control panel and faceplate may communicate with each other, such communication may be by physical interaction, such as a contact switch on the panel being activated by the placement of the overlay for one configuration, and the faceplate for the second configuration having a notch or operative so that the contact switch is not activated, thus telling the machine to configure for the second configuration.

Similarly, magnets with RFID tags could be placed on the faceplate or overlay and reed switches, sensors, or other devices to sense the presence of the magnets, RFID tags, or overlay itself could be placed on the control panel to determine which faceplate is present, and hence, which configuration the machine should operate in.

BRIEF DESCRIPTION OF DRAWINGS

The present disclosure will be described hereafter with reference to the attached drawings which are given as a non-limiting example only, in which.

Figure 1:
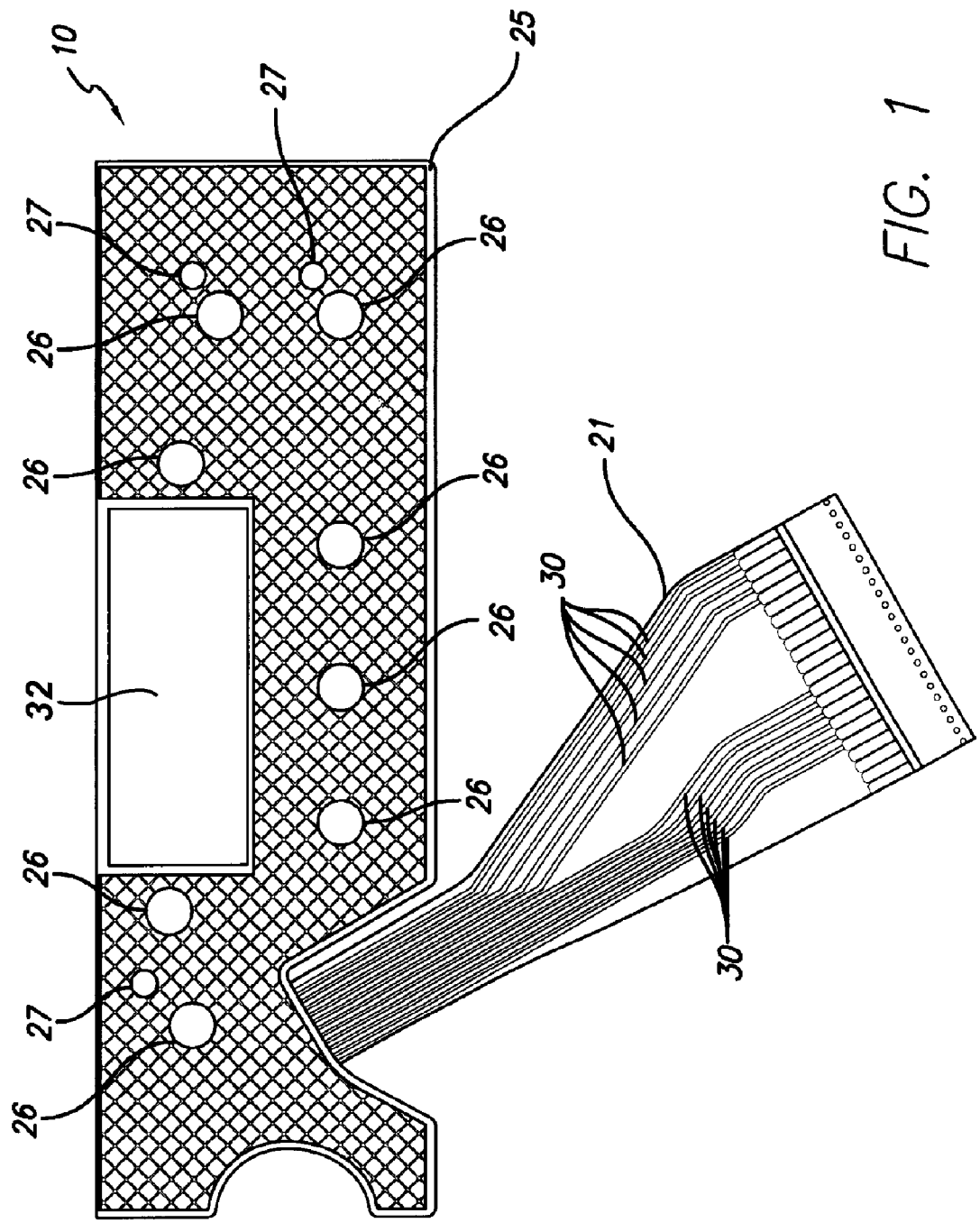
FIG. 1 is a view of a control panel with an overlay portion removed from the underlying circuit board structure.

The exemplification set out herein illustrates embodiments of the disclosure that is not to be construed as limiting the scope of the disclosure in any manner. Additional features of the present disclosure will become apparent to those skilled in the art upon consideration of the following detailed description of illustrative embodiments exemplifying the best mode of carrying out the disclosure as presently perceived.

DETAILED DESCRIPTION OF PREFERRED EMBODIMENT

While the present disclosure may be susceptible to embodiment in different forms, there is shown in the drawings, and herein will be described in detail, embodiments with the understanding that the present description is to be considered an exemplification of the principles of the disclosure and is not intended to be exhaustive or to limit the disclosure to the details of construction and the arrangements of components set forth in the following description or illustrated in the drawings.

A reconfigurable control panel 10 and first and second overlays 15 and 16 of the present invention are shown in the FIGS. 1-6. Terms including beverage, brewed, brewing, brewing substance, brewed liquid, and brewed beverage as may be used herein are intended to be broadly defined as including, but not limited to, the brewing of coffee, tea and any other beverages. This broad interpretation is also intended to include, but is not limited to any process of dispensing, infusing, steeping, reconstituting, diluting, dissolving, saturating or passing a liquid through or otherwise mixing or combining a beverage substance with a liquid such as water without limitation to the temperature of such liquid unless specified. This broad interpretation is also intended to including, but is not limited to beverage substances such as ground coffee, tea, liquid beverage concentrate, powdered beverage concentrate, flaked, granular, freeze dried or other forms of materials including liquid, gel, crystal or other forms of beverage or food materials to obtain a desired beverage or other food product.

Figure 2:
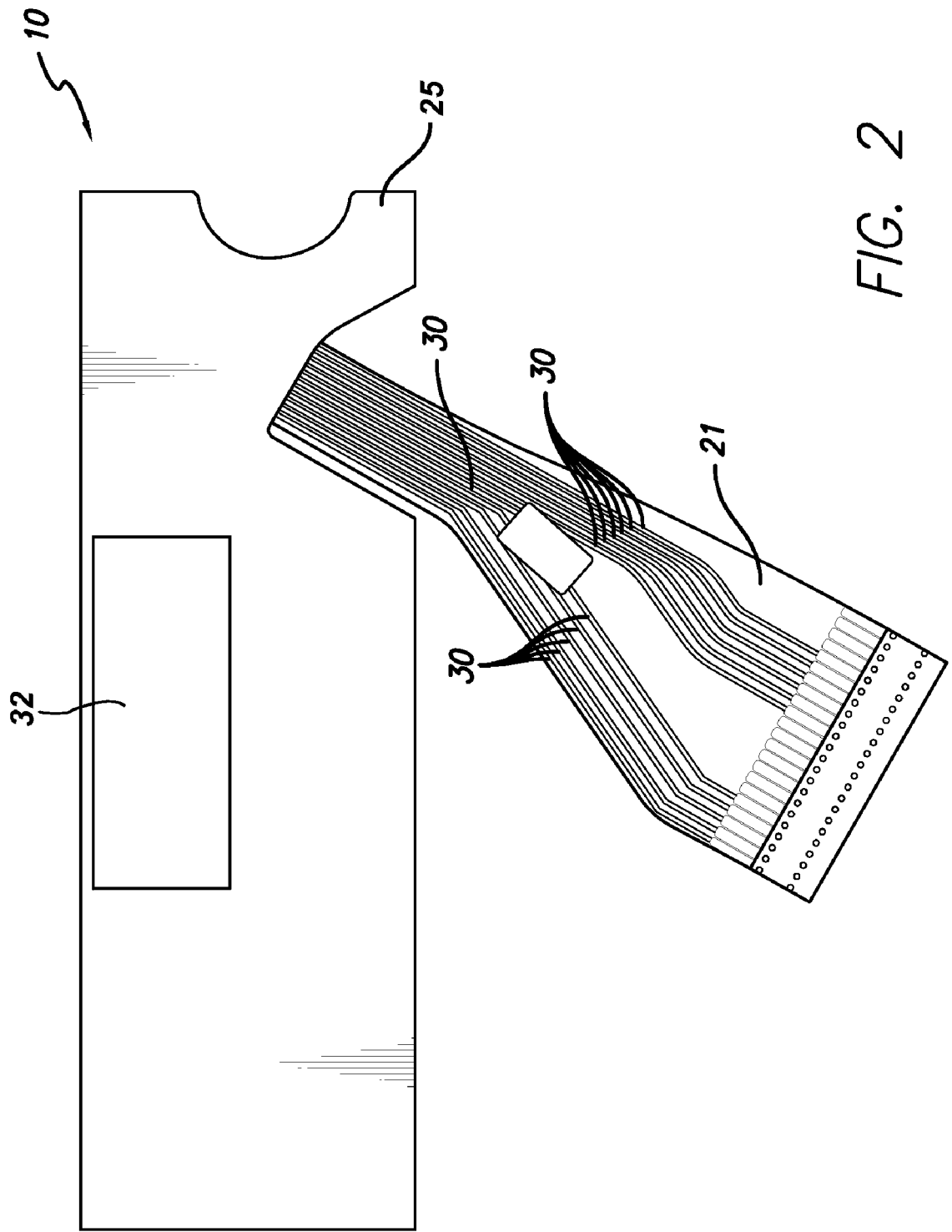
FIG. 2 is a view of a control panel having a ribbon cable extending from the circuit board, and an adhesive surface on the circuit board for attaching the control panel to a brewer.

In FIGS. 1 and 2, a control panel 10 is shown, including a printed circuit board 25 and a ribbon cable connector 21 for connecting the control panel 10 with the operating electronics of the brewer or other device to be controlled. The electronics of the brewer can vary, but are preferably digital logic devices or controllers that are reconfigurable, such as programmable logic controllers or "PLCs".

The control panel 10 is a generally planar structure including a circuit board 25, a plurality of switches 26, and LEDs 27. Electrical conductors or tracers extend between the switches, LEDs and any other device that might be attached to the circuit board. The traces provide a cost efficient way of providing electrical paths between these components and connecting them directly to the ribbon cable 21. While the specific traces on the circuit board are not shown, one of ordinary skill in the art will understand how to connect the various switches using traces and connecting them to the ribbon cable. The circuit board 25 may be a standard printed circuit board, or may be any other material or substrate on which or in which the components such as switches 26 and electrical conductors or traces 30 can be placed. A circuit board 25 made of vinyl, nylon, fiberglass, composite, or other rigid or flexible material used for circuit boards.

The control panel 10 includes a transparent window 32 allowing viewing of the area behind the control panel 10. The window 32 is preferably a clear plastic formed as part of or as a coating over the circuit board 25. In alternate embodiments, the window 32 may be an aperture in the control panel 10, still allowing viewing of the area behind the control panel 10.

In a typical application, when the control panel 10 is mounted on a brewer, the window 32 will be placed over or in registration with an informative display, allowing the user to view the display, while protecting the display from scratches, spills, debris, or other damage. If the control panel 10 instead has an aperture in the place of the window 32, the overlay can include a clear portion to allow viewing of the display. In other embodiments, the display could be incorporated into or mounted onto the control panel 10 and connected to the traces 30 and other electronics.

Figure 3:
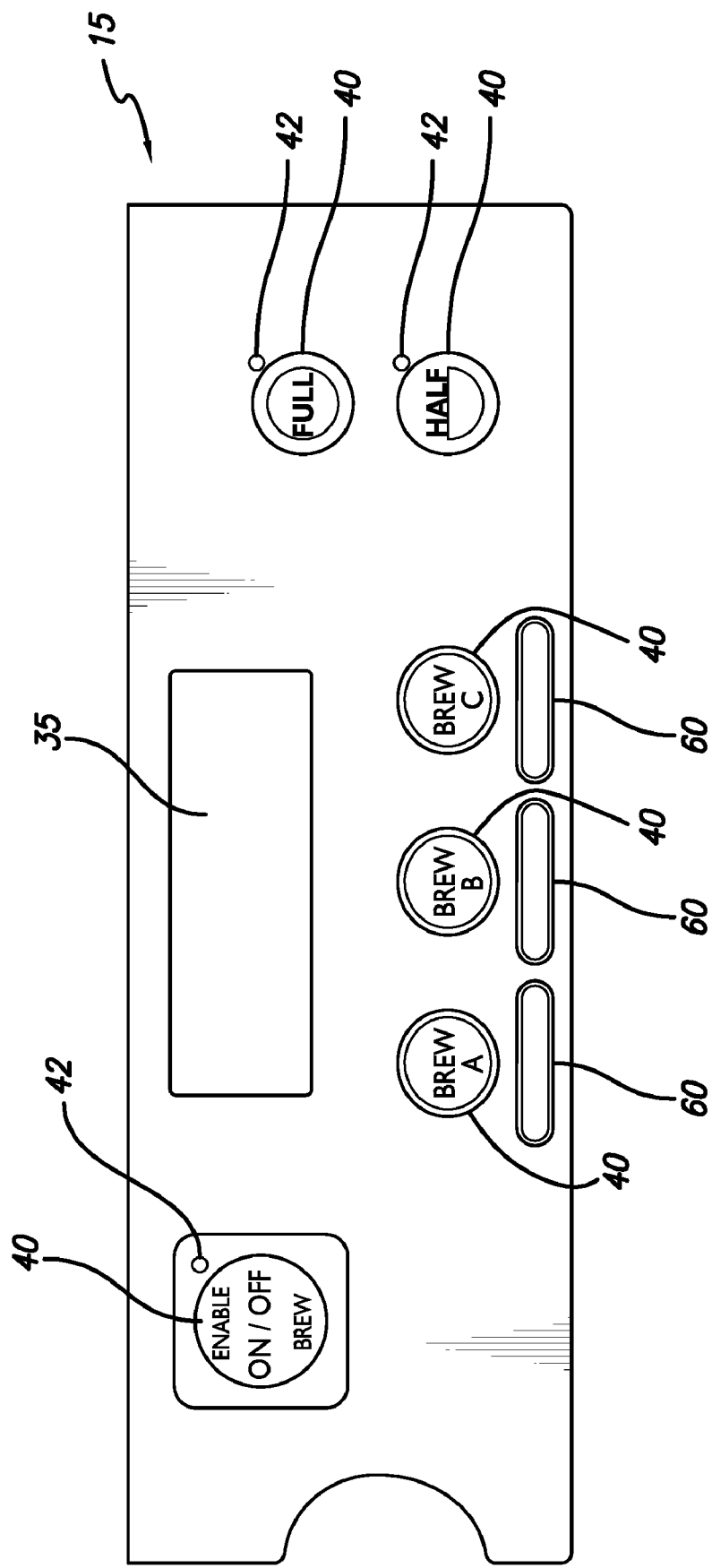
FIG. 3 is a front view of a first overlay showing embossed or relieved control areas which correspond to switches on the circuit board.

As shown in FIG. 3, a first overlay 15 is provided which can be positioned on top of the control panel 10 and provides correspondence between select components such as switches 26 and LEDs 27. Additionally, an opening 35 is provided on the face plate corresponding to the window 32 of the control panel 10. The first overlay 15 can be attached to the control panel 10 using of an adhesive or other attaching devices such as fasteners, magnetic pieces, heat, ultrasonic or chemical welding, tapping, clamping or any other attachments for retaining the first overlay 15 to the control panel 10 which are known or will become to be known in the future. The surface of the board 25 in FIG. 2 has an adhesive layer used to stick to panel 10 to the brewer structure. The adhesive may be a permanent type of adhesive or may be an adhesive which is selectively removable. As will be described in greater detail below, a selectively removable adhesive may allow the owner of the equipment to periodically change the overlay for a variety of reasons.

The first overlay 15 includes control areas 40 which register with the switches 26 when the first overlay 15 is positioned on or placed in registration with the control panel 10. The first overlay 15 also includes light transmitting portions 42 to allow the LEDs 27 to be visible to the user through the portions 42. Corresponding structures can be found on the second overlay 16, shown in FIGS. 5 and 6. These attributes of features of the first overlay 15 also apply to the second overlay 16, or any other overlay used with the invention. The second overlay 16 includes control areas 50, light transmitting portions 52, as well as an opening 55.

Figure 4:
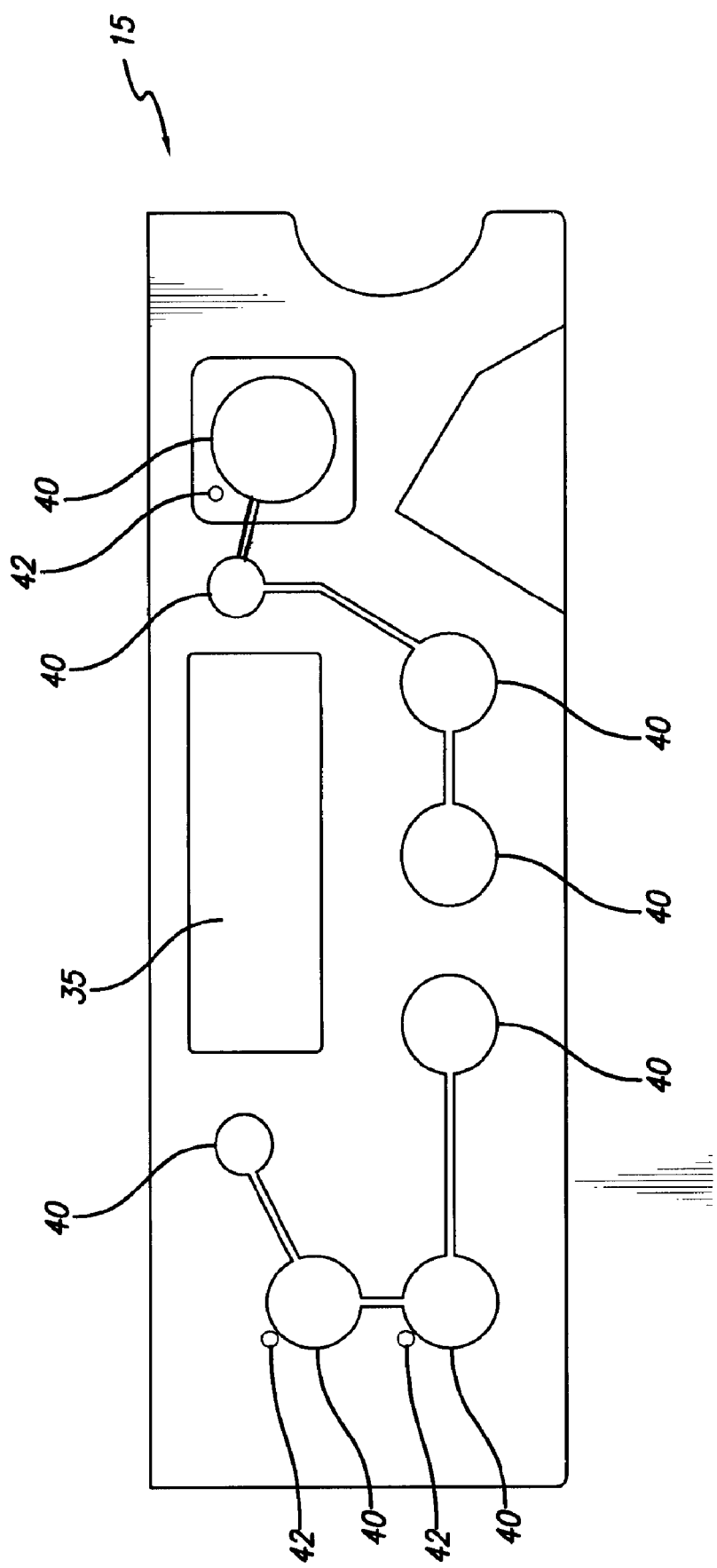
FIG. 4 is a rear view of a first overlay.

With reference to FIG. 4, a rear side of the first overlay 15 is shown. It can be seen that the control areas 40 formed in the first overlay 15 provide a recess or concave area (from the perspective of FIG. 4) for receiving a portion of the control switch 25 carried on the control panel 10. In the embodiment as shown in FIG. 1, the control switch 26 projects slightly away from the plane of the circuit board 25. Additionally, even in an embodiment in which the control switch 26 has nominal or no projection away from the plane of the circuit board, a recessed area may be provided in the control area 40. This may help to provide a more natural touch and physical feedback when actuating a switch, by allowing the surface of the overlay 15 to deform when a user activates the underlying control switch 26, but still presenting a generally smooth, generally continuous, opening-free surface of the overlay 15 presented to the user.

In at least one embodiment, adhesive is removed from the control area 26 so as to prevent sticking of the first overlay 15 surface to the switch 26. While the areas surrounding the control areas 40 can be provided with adhesive or other means for attaching the first overlay 15 to the control panel 10, the control areas 40 may be left void of adhesive or other attachments. These attributes also apply to the second overlay 16.

Figure 5:
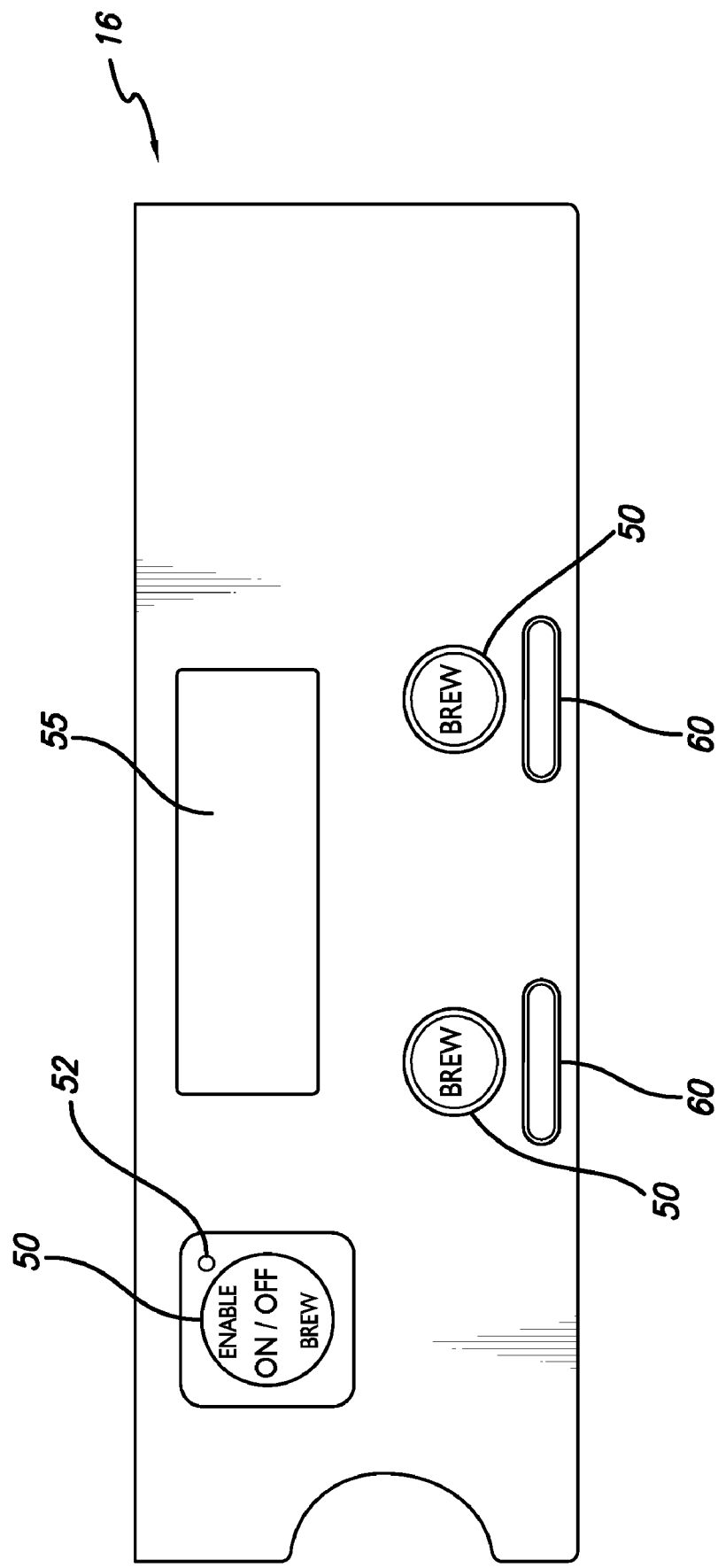
FIG. 5 is a front view of a second overlay.
Figure 6:
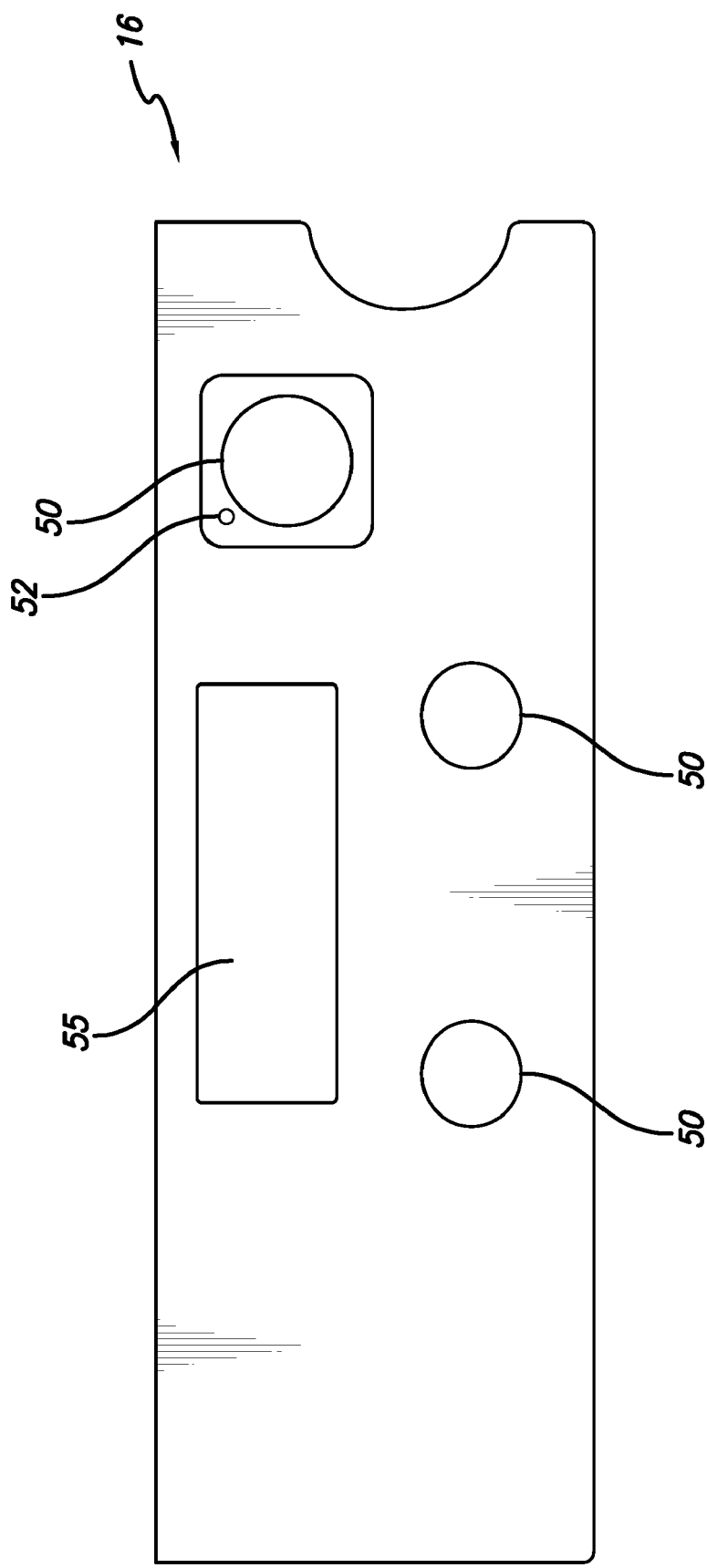
FIG. 6 is a rear view of a second overlay.

In the embodiment as shown, there is generally a one-to-one correspondence between the control areas 40 on the first overlay 15 and the control switches 26 on the control panel 10. That is to say that when the overlay 15 is placed on the control panel 10, each control switch 26 has a control area 40 over it, such that a user pressing the control area 40 will interact with the underlying control switch 26. However, in the second overlay 16 as shown in FIG. 5, there is not a one-to-one correspondence between the control areas and control switches. For instance in the second overlay 16 the control area 40 "BREW B" present in the first overlay 15 shown in FIG. 3 is missing from FIG. 5 along with the "full" and "half" control areas 40. An important aspect of the present disclosure is that the same control panel 10 and switch configuration can be used with the first overlay 15, the second overlay 16 and any number of additional overlays configured for use with the circuit board. In other words, while the overlay may include up to the same number of buttons as the circuit board, the overlay need not have the same number.

This feature allows a single "generic" circuit board to be used with multiple overlays. This is of value of to the equipment industry such that a single circuit board can be specified having multiple components thereon. By using one generic circuit board for a variety of beverage brewers or other equipment cost efficiencies can be achieved in the production of the circuit board and ribbon cable assembly. The lower cost overlay can be produced to provide specific embodiments for specific brewers.

The control panel 10 and switch configuration are programmable. The programmable control panel 10 allows the identity of the switch 26 to be programmed to correspond to various control features. For example, with reference to the first overlay 15 shown in FIG. 3, the control area 40 "Brew A" may be one recipe, the control area 40 "Brew B" may be another recipe and the control area 40 "Brew C" may be yet a third recipe. However, with regard to the second overlay 16 as shown in FIG. 5, only two choices are provided. In this regard, the missing control area 40 labeled "B", missing from the second overlay 16, can be deactivated. In other words, while the control switch 26 is provided on the control panel 10, a corresponding control area 40 is not present on the second overlay 16. The switch 26 is deactivated in the system programming.

Additionally, specific identifiers shown by the oblong shapes 60 underneath the "brew" selections may be provided. In this regard, individual oblong adhesive attachments can be added to provide recipe names or other indicia as selected by the user.

The programming and the switches 26 may also allow the user to calibrate the control panel 10 and overlay combination to the machine. In this regard, a user may be able to program the machine on site when adding or removing an overlay.

Additionally, a radio frequency identification device or chip ("RFID") or other information delivery device may be provided on the overlay 15 and a corresponding RFID reader or sensor on the control panel 10 or brewer. In this regard, such an RFID or other reader and information delivery device combination may eliminate the need to program the overlay and control panel 10 configurations. For example, if a user wishes to switch an overlay, the overlay can be removed from the control panel 10. The new overlay when reattached to the control panel 10 includes an RFID attached, embedded, or otherwise carried the overlay. The RFID is located on the overlay at a location to correspond to the RFID reader on the control panel 10. The reader and chip provide calibration and programming of the overlay with the control panel 10 without action of the user. Any variety of reasons may be they have caused the user to switch the overlay. For example, the overlay may be provided with advertising, seasonal displays, recipe names, charitable advertisements or other information. As another example, the overlays can be changed if a user buys a machine from another party and wishes to personalize the machine. The many reasons for changing the overlay may or may not benefit from use of an information delivery device on the overlay. As such the ability to change the overlay may be useful for a variety of reasons as noted above even without the programming feature. The adhesive fastener or other means for attaching the overlay to the underlying circuit board may be used depending on the anticipated need to change the overlay. For example, if a franchise operation anticipates using changeable overlays for a variety or purposes, the adhesive, fastener or other attachment means will be chosen to facilitate such changing. In contrast, if a product is being designed for off-the-shelf use without any customization or flexibility, a more permanent adhesive or other attachment means may be used.

Some machines may have RFID readers related to recipe reading associated with a coffee package or funnel. The RFID could be positioned closed enough on the overlay proximate the reader to allow the reader to recognize the overlay RFID and eliminating the need for a second RFID reader. Also, the overlay RFID could also carry and provide information relating to seasonal advertising or messages for display on a corresponding display device which information is associated with the exchange of the overlay or other information.

In another embodiment, the control panel 10 can be manufactured with the most common version of the overlay attached to the control panel 10. If a different overlay is required, the user would apply another overlay over the original overlay. The system allows the user to program, reset, or otherwise calibrate the second overlay to the control panel 10. This programming may allow the user to turn off unneeded switches 26 or activate needed switches 26.

While this disclosure has been described as having an exemplary embodiment, this application is intended to cover any variations, uses, or adaptations using its general principles. It is envisioned that those skilled in the art may devise various modifications and equivalents without departing from the spirit and scope of the disclosure as recited in the following claims. Further, this application is intended to cover such departures from the present disclosure as come within the known or customary practice within the art to which it pertains.

The invention claimed is:

1. A reconfigurable control panel assembly to allow for the production of multiple control panel variations using a common circuit board, the reconfigurable control panel comprising:

the common circuit board having a generally planar structure and being generally rigid;

a connector coupled to the common circuit board;

components carried on the common circuit board;

electrical conductors associated with the common circuit board, the electrical conductors coupled to corresponding components on the circuit board;

a prepared overlay selectively positionable on the common circuit board providing control areas in registration with at least one of the corresponding components on the common circuit board;

the at least one of the components on the common circuit board being responsive to programming for activation or deactivation to provide registration with selected components and corresponding control areas on the overlay; and wherein the overlay is one of a variety of overlays that can be selected for compatible use with the common circuit board for allowing a single common circuit board to be compatibly used with the variety of overlays, one at a time.

2. The control panel of claim 1, further comprising lights coupled to the common circuit board and corresponding openings on the overlay for display of at least one of the lights through the overlay.

3. The control panel of claim 1, further comprising lights coupled to the common circuit board; and the overlay including portions through which light is emitted from the lights.

4. The control panel of claim 1, wherein the overlay is attached to the common circuit board using an adhesive.

5. The control panel of claim 4, wherein the adhesive provides a releasable attachment of the overlay on the common circuit board.

6. The control panel of claim 1, further comprising an information delivery device on at least one of the overlay and the common circuit board for proving information relative to information identifying at least the portion on which the delivery device is attached.

7. The control panel of claim 1, further comprising a radio frequency identification device carried on the overlay for identifying the overlay to program the overlay relative to the components on the common circuit board to activate or deactivate the selected components corresponding to control areas on the overlay.

8. The control panel of claim 1, further comprising a second overlay attachable to a first overlay for changing the control of the components on the common circuit board.

9. A reconfigurable control panel assembly in combination with a beverage brewer, the reconfigurable control panel assembly allowing for the production of multiple control panel variations using a common circuit board, the reconfigurable control panel assembly comprising:
   the common circuit board having a generally planar structure and being generally rigid;
   a connector coupled to the common circuit board;
   components carried on the common circuit board;
   electrical conductors associated with the common circuit board, the electrical conductors coupled to corresponding components on the circuit board;
   a prepared overlay selectively positionable on the common circuit board providing control areas in registration with at least one of the corresponding components on the common circuit board;
   the at least one of the components on the common circuit board being responsive to programming for activation or deactivation to provide registration with selected components and corresponding control areas on the overlay; and
   wherein the overlay is one of a variety of overlays that can be selected for compatible use with the common circuit board for allowing a single common circuit board to be compatibly used with the variety of overlays.

10. The control panel of claim 9, further comprising a second overlay attachable to a first overlay for changing the control of the components on the common circuit board.

11. The control panel of claim 9, further comprising lights coupled to the common circuit board and corresponding openings on the overlay for display of at least one of the lights through the overlay.

12. The control panel of claim 9, further comprising lights coupled to the common circuit board; and
   the overlay including portions through which light is emitted from the lights.

13. The control panel of claim 9, wherein the overlay is attached to the common circuit board using an adhesive.

14. The control panel of claim 13, wherein the adhesive provides a releasable attachment of the overlay on the common circuit board.

15. The control panel of claim 9, further comprising an information delivery device on at least one of the overlay and the common circuit board for proving information relative to information identifying at least the portion on which the delivery device is attached.

16. The control panel of claim 9, further comprising a radio frequency identification device carried on the overlay for identifying the overlay to program the overlay relative to the components on the common circuit board to activate or deactivate the selected components corresponding to control areas on the overlay.

* * * * *